(12) United States Patent
Meissner et al.

(10) Patent No.: US 11,360,205 B2
(45) Date of Patent: Jun. 14, 2022

(54) METHOD FOR GENERATING A COMPACT REPRESENTATION OF RADAR DATA, RADAR DEVICE AND RADAR DATA PROCESSING CIRCUIT

(71) Applicant: Infineon Technologies AG, Neubiberg (DE)

(72) Inventors: Paul Meissner, Feldkirchen bei Graz (AT); Markus Haltmeier, Innsbruck (AT); Farhan Bin Khalid, Munich (DE); Andre Roger, Munich (DE); Johannes Sappl, Innsbruck (AT)

(73) Assignee: Infineon Technologies AG

( * ) Notice: Subject to any disclaimer, the term of this patent is extended or adjusted under 35 U.S.C. 154(b) by 450 days.

(21) Appl. No.: 16/385,392

(22) Filed: Apr. 16, 2019

(65) Prior Publication Data

US 2019/0317205 A1 Oct. 17, 2019

(30) Foreign Application Priority Data

Apr. 16, 2018 (DE) .......................... 102018109001.3

(51) Int. Cl.
*G01S 13/58* (2006.01)
*H03M 7/30* (2006.01)
*G01S 7/35* (2006.01)
*G01S 13/931* (2020.01)
*G01S 13/34* (2006.01)

(52) U.S. Cl.
CPC ............ *G01S 13/584* (2013.01); *G01S 7/354* (2013.01); *G01S 13/34* (2013.01); *G01S 13/931* (2013.01); *H03M 7/30* (2013.01); *G01S 7/356* (2021.05)

(58) Field of Classification Search
CPC ........ G01S 13/584; G01S 7/354; G01S 13/34; G01S 13/931; G01S 7/356; H03M 7/30
See application file for complete search history.

(56) References Cited

U.S. PATENT DOCUMENTS

2015/0346321 A1    12/2015  Jansen et al.
2016/0018511 A1*    1/2016  Nayyar ..................... G01S 7/03
                                                               342/70
2016/0252607 A1*    9/2016  Saboo ..................... G01S 13/02
                                                              342/107

(Continued)

FOREIGN PATENT DOCUMENTS

EP          2980996 A1    2/2016
WO     2015185058 A1    12/2015

OTHER PUBLICATIONS

B. Erol and M. G. Amin, "Radar Data Cube Analysis for Fall Detection," 2018 IEEE International Conference on Acoustics, Speech and Signal Processing (ICASSP), 2018, pp. 2446-2450, doi: 10.1109/ICASSP.2018.8461512. (Year: 2018).*

(Continued)

*Primary Examiner* — Thomas M Hammond, III
*Assistant Examiner* — Ebel M Rodriguez-Benitez
(74) *Attorney, Agent, or Firm* — Design IP (57) ABSTRACT

A method for generating a compact representation of radar data, includes determining at least one data peak within a multi-dimensional representation of radar data; and compressing radar data samples of the multi-dimensional representation within a limited neighborhood around the at least one data peak to generate the compact representation.

22 Claims, 7 Drawing Sheets

(56) References Cited

U.S. PATENT DOCUMENTS

| | | | |
|---|---|---|---|
| 2017/0054449 A1* | 2/2017 | Mani | H03M 7/24 |
| | | | 342/195 |
| 2017/0363731 A1 | 12/2017 | Bordes et al. | |
| 2018/0038941 A1* | 2/2018 | Wang | G01S 7/003 |
| | | | 342/26 |
| 2019/0037136 A1* | 1/2019 | Downing | 348/239 |

OTHER PUBLICATIONS

X. Hu, N. Tong, Y. Guo and S. Ding, "MIMO Radar 3-D Imaging Based on Multi-Dimensional Sparse Recovery and Signal Support Prior Information," in IEEE Sensors Journal, vol. 18, No. 8, pp. 3152-3162, 15 Apr. 15, 2018, doi: 10.1109/JSEN.2018.2810705. (Year: 2018).*

* cited by examiner

METHOD FOR GENERATING A COMPACT REPRESENTATION OF RADAR DATA, RADAR DEVICE AND RADAR DATA PROCESSING CIRCUIT

FIELD

Examples relate to methods for generating a compact representation of radar data, radar devices, and radar data processing circuits.

BACKGROUND

The amount of data generated by a radar device in an automotive application may be significant. A single frequency-modulated continuous wave (FMCW) radar device comprises at least one transmit chain to generate the radar signal to be sent and at least one receive chain to receive and process the reflected radar signal. The transmit chain comprises an Oscillator circuit to generate the radar signal and a power amplifier to amplify the radar signal. Typical frequencies of local oscillator signals are, for example, between 38 GHz and 77 Ghz. The power amplifier is coupled to one or more transmit antennas which radiate the radar signal into the environment. The reflected radar signal is typically received by an array of receive antennas. The reflected radar signal received by a single antenna is amplified by a low noise amplifier before being further processed. In a frequency-modulated continuous wave radar device, the oscillator circuit is operated in cycles in which the local oscillator signal exhibits a time varying frequency, for example increasing or decreasing linearly in a ramp like manner. Within a cycle, the local oscillator signal is simultaneously used to generate the radar signal to be sent as well as to downmix the received radar signal into a downconverted radar signal. The downconverted radar signal may also be referred to as a baseband signal. The frequency of the downconverted radar signal so correlates to the time difference between sending and receiving the radar signal and, hence, to the distance of a reflecting object.

In order to not only estimate the distance and direction of the reflecting object, multiple cycles of oscillator signals are jointly processed to also determine a velocity of the reflecting object. The joint data to be processed, hence, includes data of multiple receive channels for a single cycle of the local oscillator signal multiplied by the number of jointly processed cycles. For each receive channel, multiple radar data samples are determined at the sample frequency, resulting in a multi-dimensional representation of radar data which is sometimes also referred to as radar data cube. In order to determine object characteristics of the reflecting objects within the field of view of a radar device, the data of the multi-dimensional representation is processed jointly, resulting in a significant computational load required to determine, for example, a direction from which reflected radar signals are received. If joint processing cannot be performed within the radar device generating the multi-dimensional representation, a high amount of data may need to be transferred to a radar data processing circuit, which may exceed the capacity of data links between the radar devices and the radar data processing circuit. It may, therefore, be desirable to reduce the amount of radar data to be processed while maintaining the capability to determine object characteristics.

SUMMARY

An embodiment relates to a method for generating a compact representation of radar data, including determining at least one data peak within a multi-dimensional representation of radar data; and compressing radar data samples of the multi-dimensional representation within a limited neighborhood around the at least one data peak to generate the compact representation. A data peak within the multidimensional representation corresponds to a reflecting target in the field of view of the radar device. A data peak may be characterized by radar data samples having a higher absolute value than a threshold value which is based on an average absolute value of all radar data samples of the multidimensional representation. Likewise, a data peak may be locally defined in that it is characterized by radar data samples having a higher absolute value than a threshold value which is based on the average absolute value of the radar data samples within a vicinity of a radar data sample under consideration. Compressing the radar data samples in a limited neighborhood around a data peak may allow for both, reducing the amount of data to be processed or transmitted and determining object characteristics with high accuracy since moderate compression of the radar data samples may be enough to reduce the overall amount of data to an acceptable level.

In an embodiment, compressing the radar data samples includes requantizing a phase component of the radar data samples within the neighborhood. Requantizing the phase component of radar data samples may allow to reduce the amount of data while maintaining sufficient phase resolution to still determine a direction of a reflected radar signal with an acceptable accuracy.

In a further embodiment, compressing the radar data samples includes representing an amplitude component of neighboring radar data samples with a reduced number of bits. Depending on the circumstances and the choice of the neighboring radar data samples, the amplitude component of neighboring radar data samples may exhibit only a moderate variation so that significant amount of data may be saved if neighboring radar data samples are jointly represented. In a further embodiment, representing the amplitude component of neighboring radar data samples includes calculating a joint parametrization for the amplitude components of the neighboring radar data samples. Using a joint parametrization may reduce the number of bits required to transmit or process the amplitude components of all radar data samples within the neighborhood while losing only an insignificant amount of information.

In a further embodiment, a mean value of the amplitude components of the neighboring radar data samples is calculated as the joint parametrization. High compression factors can be achieved if all amplitude components of the neighboring radar data samples are represented by a single value, e.g. by the arithmetic mean value of all amplitude components of the neighboring radar data samples.

A further embodiment includes determining the neighboring radar data samples by selecting data bins within the multi-dimensional representation, the selected data bins having different positions in a receive channel dimension of the multi-dimensional representation and identical positions in the remaining dimensions. A receive channel as understood herein may include physical receive channels as well as virtual receive channels. Multiple virtual receive channels may be provided by a single physical receive channel by multiplexing transmit channels into the single physical receive channel. For example, time-division multiplexing or code-division multiplexing of n transmit channels into one physical receive channel may provide n virtual receive channels for one physical receive channel. A receive channel dimension is given by the receive channel for which the radar data samples of the other dimensions are generated. For example, in a phased array without virtual receive channels, a receive channel may correspond to a single antenna of the array. The amplitude components of radar data samples of same bins do not change significantly amongst the receive channels. This can be used for compression by using chosen neighboring radar data samples to jointly represent their amplitude components resulting in a high compression factor at only moderate loss of information.

A further embodiment includes determining remaining data peaks within the multi-dimensional representation; compressing the radar data samples of the multi-dimensional representation within limited neighborhoods around all remaining data peaks; and transmitting the compressed radar data samples as the compact representation of radar data. Performing compression for all detectable data peaks may allow to efficiently represent the radar data of the entire multi-dimensional representation.

In a further embodiment, the multi-dimensional representation includes a first dimension for a distance, a second dimension for a velocity and a third dimension for a receive channel. The embodiment may so serve to efficiently represent a multi-dimensional representation of radar data which has already been preprocessed to contain complex valued radar data samples associated to distances and relative velocities.

In a further embodiment, the multi-dimensional representation includes a first dimension for a time, a second dimension for a ramp and a third dimension for a receive channel. The embodiment may so serve to efficiently represent a multi-dimensional representation of radar data in the time domain which contains radar data samples of multiple different ramps.

An embodiment of a method for generating a compact representation of radar data based on a multi-dimensional representation of radar data in which a receive channel dimension represents multiple receive channels used for acquiring the radar data, includes selecting data bins within the multi-dimensional representation, the selected data bins having different positions in the receive channel dimension and identical positions in the remaining dimensions of the multi-dimensional representation. An amplitude component of radar data samples of the selected data bins is represented with a reduced number of bits. The amplitude components of radar data samples are likely to not change significantly amongst the receive channels. Using the so chosen neighboring radar data samples to jointly represent their amplitude components may, therefore, result in a high compression factor at only moderate loss of information.

A further embodiment of a method for generating a compact representation of radar data further includes calculating a joint parametrization for the amplitude component of the neighboring radar data samples to represent the amplitude component with the reduced number of bits.

An embodiment of a radar device includes radar data generation circuitry configured to provide a multi-dimensional representation of radar data; and a radar data processor configured to determine at least one data peak within the multi-dimensional representation; and to compress radar data samples of the multi-dimensional representation within a limited neighborhood around the at least one data peak to generate a compact representation of radar data.

In a further embodiment of the radar device, the radar data processor is further configured to represent an amplitude component of neighboring radar data samples with a reduced number of bits.

In a further embodiment of the radar device, the radar data processor is further configured to requantize a phase component of the radar data samples within the neighborhood.

A further embodiment of the radar device includes an output interface configured to output the compact representation of radar data. The embodiment of the radar device may be used to generate a compact representation of radar data which can be transferred to a subsequent radar data processing circuit having higher computational power to, for example, use more sophisticated algorithms to analyze the radar data than possible within the radar device.

A further embodiment of the radar device further includes a processor configured to estimate a direction of arrival of a radar echo based on the compact representation. Working on the compact representation of radar data may allow to determine object characteristics of reflecting objects in the field of view of the radar device already within the radar device itself, since only a reduced amount of data has to be analyzed.

An embodiment of a radar data processing circuit, includes an input interface configured to receive a compact representation of radar data, the compact representation including compressed radar data samples for a limited neighborhood around at least one data peak; and a processor configured to estimate object characteristics based on the compact representation. The radar data processing circuit capable to operate on the compact representation of radar data may be used with comparatively low bandwidth automotive installations to receive the relevant data required to determine object characteristics based on radar data determined within a radar device.

In a further embodiment of the radar data processing circuit, the processor is configured to determine a direction of arrival of a radar echo. Based on the compact representation of radar data which allows to operate on individual radar data samples in addition to determined peak location information, more sophisticated algorithms can be used to determine the direction of arrival of the radar echo.

The processor may be configured to attribute a radar reflecting object to one of multiple object classes. Operating on radar data samples of the compact representation may allow to derive more complex information on the individual objects, such as for example obtaining radar images having multiple pixels or determining as to whether the object associated to the data peak in the multi-dimensional representation is a vehicle, a pedestrian, a cyclist, a motorcyclist, a building, a tree or a traffic light, to just name few examples. Further embodiments may even be enabled to localize the radar device itself using on radar images with multiple pixels.

A further embodiment of the radar data processing circuit further includes a decompression circuit configured to evaluate a joint parametrization to calculate amplitude components of neighboring radar data samples.

BRIEF DESCRIPTION OF THE DRAWINGS

Some examples of apparatuses and/or methods will be described in the following by way of example only, and with reference to the accompanying Figures, in which.

DETAILED DESCRIPTION

Various examples will now be described more fully with reference to the accompanying drawings in which some examples are illustrated. In the Figures, the thicknesses of lines, layers and/or regions may be exaggerated for clarity.

Accordingly, while further examples are capable of various modifications and alternative forms, some particular examples thereof are shown in the Figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the Figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Embodiments described below relate to a new concept of data compression in radar devices, for example in a FMCW radar device. In an example FMCW radar device, an oscillator circuit is operated in cycles in which a generated local oscillator signal exhibits a time varying frequency. In other words, the frequency is modulated during a cycle, for example increasing or decreasing linearly in a ramp like manner. Within a single frequency modulation cycle (herein referred as ramp), the local oscillator signal is simultaneously used to generate the radar signal to be sent as well as to downmix the received radar signal into a downconverted radar signal. The downconverted radar signal may also be referred to as a baseband signal. The frequency of the downconverted radar signal correlates to the time difference between sending and receiving the radar signal and, hence, to the distance of a reflecting object. The downconverted radar signal is digitized with a given sampling frequency to result with multiple real-valued radar data samples per receive channel and per ramp. In a FMCW radar device, multiple receive channels are jointly processed in order to be able to determine the direction of an object with respect to the radar device. Further, multiple cycles are jointly processed to be able to determine a speed of an object relative to the radar device. The resultant data to be jointly processed so comprises multiple radar data samples per receive channel and per cycle, resulting in a multidimensional representation (matrix) of radar data.

Figure 1:
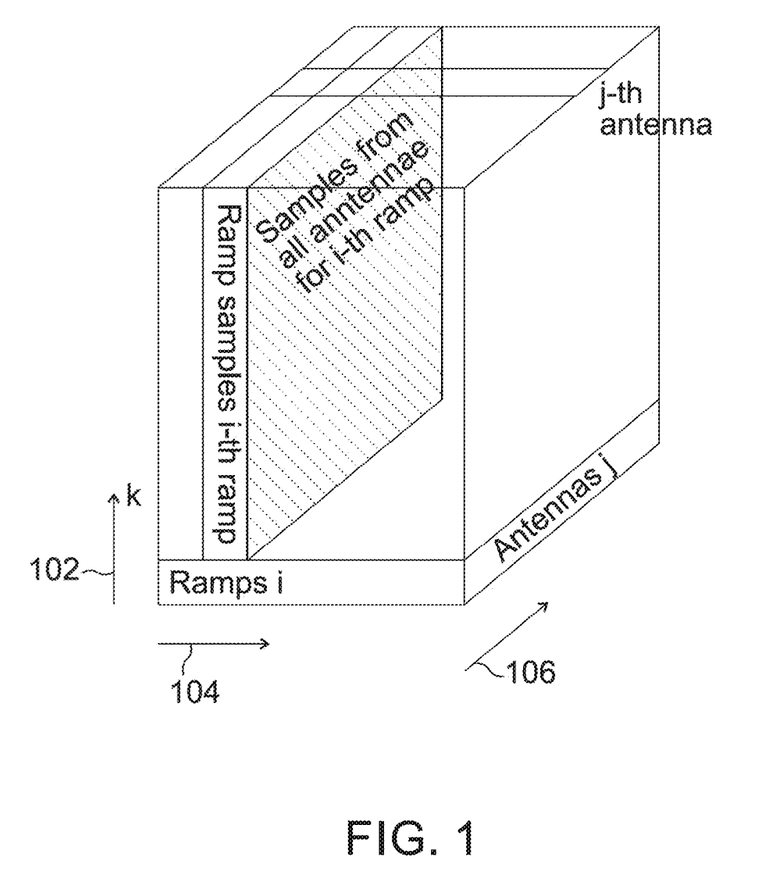
FIG. 1 shows an example of multidimensional representation of radar data comprising time domain radar data samples.

FIG. 1 illustrates an example for a multidimensional representation of radar data comprising real-valued radar data samples in the time domain. In the exemplary three-dimensional representation, a first dimension 102 is time, a second dimension 104 is a ramp number and a third dimension 106 is a receive channel dimension. The multi-dimensional representation of radar data illustrated in FIG. 1 contains all radar data samples that are jointly processed to—at least—determine a distance, a relative velocity and a direction of a radar reflecting object within the field of view of a radar device. Multiple ramps of the local oscillator signals are processed and each ramp is represented by a two-dimensional array of radar data samples which are ordered along the second dimension 104 which indicates the cycle. For each ramp and receive channel, multiple samples of the received radar signal are recorded at the sample rate. The subsequently recorded radar data samples per receive channel and ramp are ordered along the first dimension 102. Likewise, the radar data samples recorded for different receive channels are ordered along the third dimension 106. A single radar data sample within the multi-dimensional representation can therefore be identified by three indices, an index i for the ramp, an index j for the receive channel and an index k for number of the sample within a sequence of samples recorded for a ramp. The triplet of indices i, j, and k are also referred to as a data bin that uniquely identifies a radar data sample. Whenever a radar echo is received, the radar data samples associated to the object causing the echo will have higher values in the data bins associated to the distance of the object causing a data peak within the multi-dimensional representation.

In other words, and as illustrated in FIG. 1, radar data samples can be organized in a so-called radar data cube, which represents the radar data in a three-dimensional representation. The three dimensions of the cube are the time-domain samples of each ramp, the individual ramps of a transmitted ramp sequence and the receive channels. In typical implementations, values may be in the order of 512-2048 for the samples, 64-512 for the number of ramps, and 4-16 for the number of channels. Such representation may result in an amount of data for standard automotive which is too big for transferring with existing interfaces to a central processing unit or to a radar processing circuit receiving data from multiple radar devices at a time. However, some higher-level processing (which may need to be located in the central processing unit) might benefit from or even require raw data to perform the necessary tasks at all or with sufficient accuracy.

Figure 2:
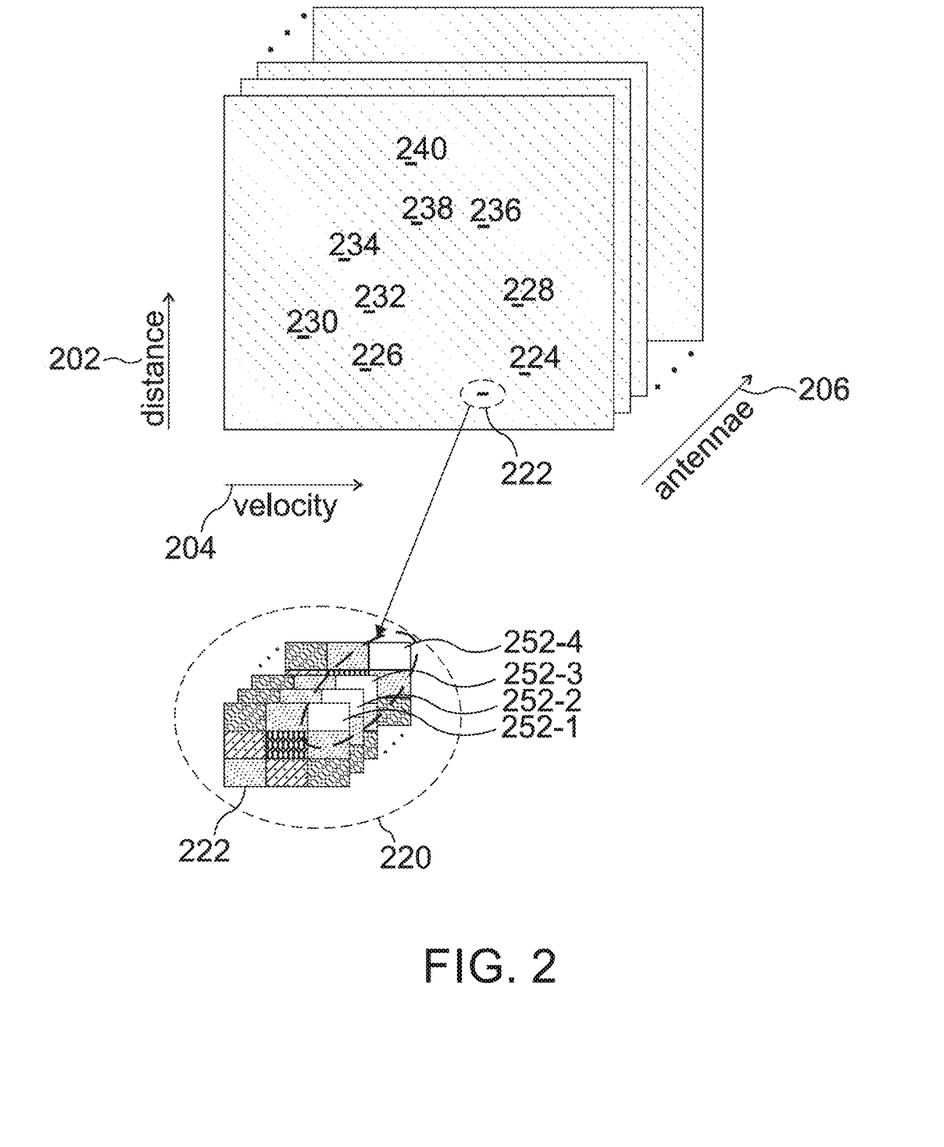
FIG. 2 shows an example of a multidimensional representation of radar data comprising complex valued radar data samples.

FIG. 2 illustrates another example of a multidimensional representation of radar data comprising complex-valued radar data samples in the frequency domain. The representation of FIG. 2 may be generated by applying a two-dimensional Fourier transform to the multidimensional representation of FIG. 1. In the multidimensional representation of FIG. 2, a first dimension 202 corresponds to distance, a second dimension 204 corresponds to a velocity and a third dimension 206 corresponds to a receive channel. That is, different positions in the first dimension 202 correspond to different distances (relative to the radar device), different positions in the second dimension 204 correspond to different velocities (relative to the radar device). Whenever a radar echo is received, the radar data samples corresponding to the reflecting object also form a data peak within the multidimensional representation of FIG. 2, as, for example, illustrated by means of data peak 222. Data peak 222 corresponds to a radar reflecting object at a distance to the radar device which is given by the position of the data peak in first dimension 202 and with a relative velocity that is given by the position of the data peak in the second dimension 204. Corresponding data peaks are also present in the further receive channel dimensions 206 since the distance and the relative velocity with respect to the multiple receive channels of a radar device may be nearly constant for the same radar reflecting object. As illustrated in FIG. 2, a data peak 222 within the multidimensional representation is characterized by one or more radar data samples having a higher amplitude component or a higher absolute value than the radar data samples in its surrounding. For example, data peak 222 may be locally defined in that it is characterized by radar data samples having a higher absolute value than a threshold. The threshold can be based on the average absolute value of the radar data samples within a vicinity of a radar data sample under consideration. However, other ways to determine a data peak may be used to determine data peaks associated to radar reflecting targets.

In other words, FIG. 2 illustrates a multidimensional representation of radar data after a two-dimensional Fourier transformation which transforms the time domain (first dimension of FIG. 1) into the distance domain and the ramp/cycle domain (second domain in FIG. 2) in the Doppler (velocity) domain. FIG. 2 illustrates a particular example of Range-Doppler (RD) matrices obtained for each receive channel. Radar reflecting objects show up as data peaks at the respective range and velocity. The complex-valued radar data samples in the RD matrices of the multi-dimensional representation of FIG. 2 can still be considered as raw data, similar to the time domain radar data samples of FIG. 1. The ADC samples received from a frontend of a radar device are processed by linear transformations (Fourier-Transformations) to arrive at the representation of FIG. 2, which may be implemented within the radar devices themselves.

While the individual dimensions in the multi-dimensional representation of FIG. 2 may correspond to different characteristics compared to FIG. 1, also the radar data samples in the multi-dimensional representation of FIG. 2 sum up to a considerable data volume which may be too high to be transmitted by data links connecting a radar device with subsequent processing circuitry. Given the high data volumes of radar data to be jointly processed, there may be a demand to be able to compress radar data samples to arrive at a more compact representation of radar data.

Figure 3:
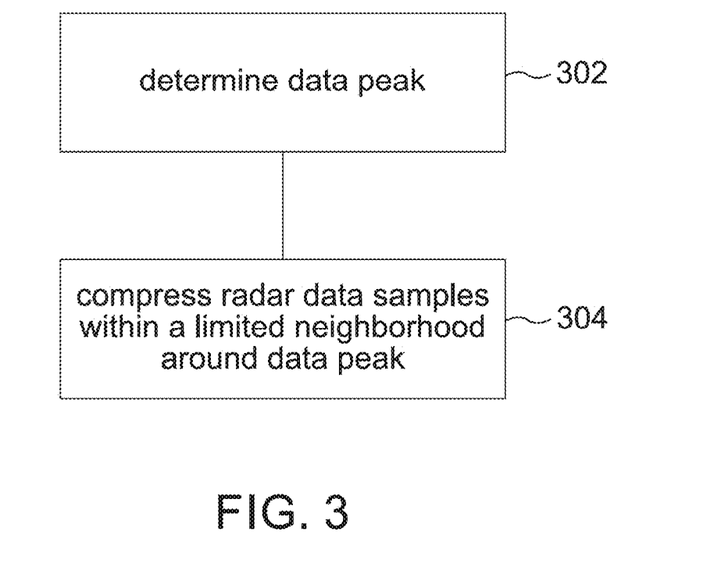
FIG. 3 illustrates a flowchart of an embodiment of a method for generating a compact representation of radar data.

FIG. 3 illustrates a flowchart of an embodiment of a method for generating a compact representation of radar data. The method operates on a multidimensional representation of radar data as, for example, illustrated in FIGS. 1 and 2.

As illustrated in FIG. 3, a compact representation of radar data is generated by determining at least one data peak 222 within the multi-dimensional representation at step 302. Further, radar data samples are compressed 304 within a limited neighborhood 220 around the data peak. As, for example, illustrated in FIG. 2, the limited neighborhood 220 around the data peak 222 may be chosen to be a predetermined number of bins around the data peak (given, e.g., by a predetermined number of indices in each of the first and second dimensions 202, 204) in every receive channel dimension 206. The choice of the limited neighborhood 220 as illustrated in FIG. 2 results in the generation of a three-dimensional selection of radar data samples, which is also referred to as a radar data Cubelet. A radar data Cubelet is a subsection of the radar data Cube in the vicinity of a data peak. Typically, a data peak corresponding to an object occurs not only in one Range Doppler map of a single receive channel but in all Range Doppler maps of the plurality of receive channels. A radar data Cubelet can therefore be generated by including the Range Doppler matrix information of a selected group of bins around a detected peak for each channel of the multiple channels. The bins taken for each receive channel include the bin with the radar data sample having the local maximum value but also of the bins surrounding the bin comprising the local maximum. Information regarding or representing a shape, a width or other characteristics of the data peak (including for example bins representing the peak shoulder) is therefore at least partially included in the radar data Cubelet. In general, the size of the Cubelet is significantly lower than a size of the full radar data Cube. The Cubelet has the same size as the Cube in the channel dimension but reduced size in the range (fast time axis) and velocity (slow time axis) direction. In the illustration of FIG. 2, the limited neighborhood 220 or Cubelet is chosen such that, within each receive channel dimension, a single data bin around the determined data peak 222 is included in the neighborhood 220. However, further embodiments may also choose different Cubelet sizes and different criteria to determine the limited neighborhood 220. For example, the size of the limited neighborhood 220 may be variable depending on the amplitude components determined for the radar data samples in the vicinity of the data peak 222. The illustrated limited neighborhood 220 is only an example. In further embodiments, the detection will result in another, eventually even asymmetric region or neighborhood that is used to compress the radar data samples therein. The method for generating a compact representation of radar data does not depend on the shape or size of the neighborhood. While the limited neighborhood 220 and its size can be chosen according to the requirements, it may be beneficial to include an appropriate number of data bins into the limited neighborhood 220 around the data peak 222 to enable data analysis algorithms to determine the object characteristics of the radar reflecting object associated to the data peak 222 with the desired accuracy. For example, the MUltiple SIgnal Classification (MUSIC) algorithm that may be used to determine a direction of arrival of the radar reflection may require a minimum number of radar data samples to achieve the desired precision of the angle estimation.

Likewise, the data peak 222 may not only be given by a single data bin but comprise multiple data bins of equal or similar strength. That is, in further embodiments, an object peak (data peak associated to an object) may also cover more than one bin (constituted by more than one radar data sample) in the RD matrix. For illustrative purposes, FIG. 2 illustrates 9 further data peaks 224 to 240 which are observed in the RD matrix and which may, e.g., be detected by e.g. a Constant False-Alarm Rate (CFAR) algorithm.

In view of transmitting information on radar data samples to an external data processing unit only for the regions of interest around the data peaks, a low data rate can be achieved while at the same time preserving the capability of accessing information on radar data samples in subsequent, computationally stronger radar data processing circuits. In other words, embodiments described herein focus on compression and transmission of the relevant data only, i.e. the results of a peak detection step and on a limited neighborhood around detected data peaks, instead of trying to compress the complete RD matrices or the ADC samples of the complete multi-dimensional representation of FIGS. 1 and 2. Some conventional approaches, instead, perform processing and estimation within the sensor or the radar device itself and transmit only an object list to the central processing unit (to a radar data processing circuit performing some higher order evaluations). Object lists typically contain detected/estimated parameters (range, velocity, direction of arrival (DoA), confidence, . . . ) of a defined number of objects and no information on the originally generated radar data samples. A data fusion task in a subsequent central processing unit (radar data processing circuit) conventionally has to rely on such higher-layer information of the object lists and can no longer access any radar data samples (raw data) to perform other, computationally more intensive, estimation tasks.

Other than only transmitting some object parameters, embodiments also transmit information on radar data samples for a certain limited neighborhood around the detected peak, e.g. complex valued RD data of all channels. Using a compact representation of radar data according to an embodiment may, therefore, allows performing computationally more intensive estimation tasks in the radar data processing circuit, such as for example high-resolution DoA algorithms (e.g. MUSIC) that are not suitable for the sensor or further classification tasks that are based on the shapes of the detected peaks.

Lossless compression of other conventional approaches may not result in lost information, but typically does also not allow for any saving of data that is significant enough for radar applications. Conventional lossy compression methods (such as image compression) may achieve higher compression rates, however, they typically result in image artefacts, that may lead to ghost targets in the radar data or that may remove important information on the data peaks, which is not acceptable for safety applications like automotive radar systems.

Figure 7:
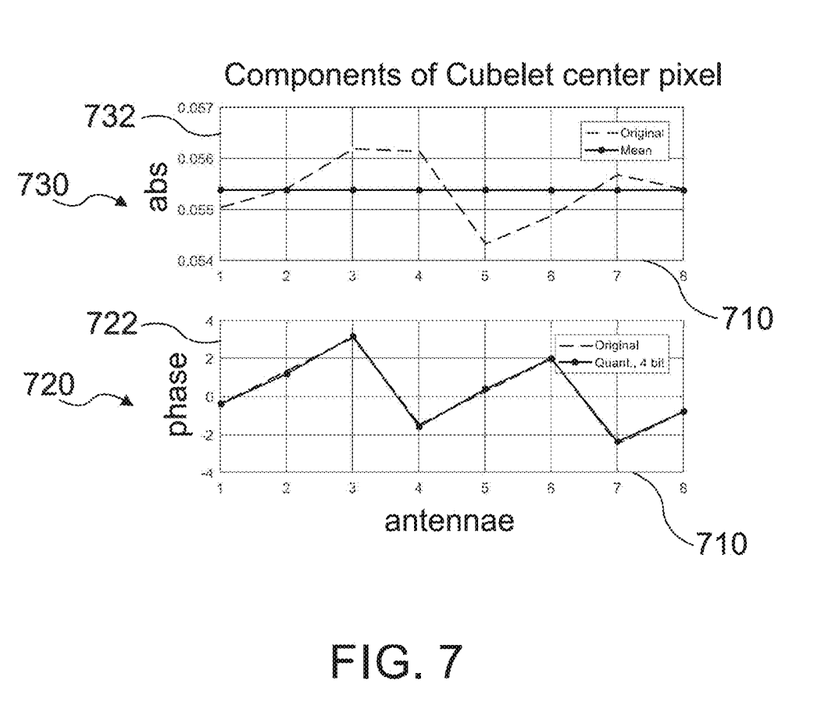
FIG. 7 illustrates an example for phase and amplitude components of radar data samples associated to a data peak.

According to some embodiments, compressing the radar data samples of a cubelet (within the limited neighborhood) involves representing an amplitude component of neighboring radar data samples with a reduced number of bits. Some embodiments compress the data along the receive channel dimension (in implementations without virtual MIMO channels, the number of receive channels may be equal to the number of antennae). FIG. 7 illustrates that radar data samples are quite compressible in this dimension. The x-axis 710 of a lower graph 720 and of an upper graph 730 illustrates the number of receive channels. The y-axis 732 of the upper graph 730 illustrates the absolute value/amplitude component of a radar data sample constituting a data peak. It can be observed that the amplitude component varies only little amongst different receive channels.

According to some embodiments, neighboring radar data samples 252-1, 252-2, 252-3, and 252-4 for the compression of the amplitude component are, therefore, determined by selecting data bins within the multi-dimensional representation, where each of the selected data bins has different positions in a receive channel dimension and identical positions in the remaining dimensions of the multi-dimensional representation. FIG. 2 illustrates a particular example for a selected group of neighboring radar data samples 252-1, 252-2, 252-3, and 252-4. A limited neighborhood around a data peak typically comprises multiple groups of neighboring radar data samples and the radar data samples of each group of neighboring data samples are jointly compressed. In other words, the neighboring radar data samples are given by a column of bins of the multi-dimensional representation. The column extends through the receive channel dimension so that the data bins within a column have different positions (indices) in a receive channel dimension and identical positions (indices) in the remaining dimensions of the multi-dimensional representation. While different options exist to reduce the number of bits (mean, linear interpolation), the further discussion will show one detailed implementation using an arithmetic mean value. This allows to transmit only one instead of $N_{ant}$ values (number of antennae/receive channels). Further embodiments may calculate another joint parametrization for the amplitude components of the neighboring radar data samples. An amplitude component is the absolute value of a respective complex valued data cube information. A phase component is the argument of the complex valued data cube information. For example, by transforming the complex values X+iY into a polar representation Aexp(iφ), the amplitude is represented by A and the phase is represented by φ.

As further illustrated in the lower graph 720 of FIG. 7, the phase component covers a limited range [−π, +π], irrespective of the receive channel. Within this range, requantizing the phase components may significantly lower a number of required bits. Consequently, according to some embodiments, compressing the radar data samples comprises requantizing a phase component of the radar data samples within the limited neighborhood. Requantizing is performed with coarser quantization steps. The requantizing can be obtained by using uniform or non-uniform quantization steps.

The following paragraphs illustrate achievable data reduction if both, compression of phase components and amplitude components are simultaneously performed.

The subsequently discussed sample implementation uses the following parameters:

$N_{ant}$ Number of antennae (or equivalently, number of virtual channels)
$N_p$ Number of pixels, i.e. size of the neighborhood around a detected peak.
$N_{bit}$ Number of bits used in the uncompressed representation. In typical systems, this is 32 for real and imaginary part of the complex RD data.
$\tilde{N}_{bit}$ Number of bits for the quantized phase values
$B_{tot}$ Total number of bits of the uncompressed data.
$\tilde{B}_{tot}$ Total number of bits of the compressed data.

As already described before, radar data samples for the 3-dimensional representation of FIG. 2 can be generated using conventional RD processing and a subsequent detection algorithm (CFAR, thresholding, . . . ) to find the data peaks associated to objects in the RD data.

Around the detected data peaks, limited neighborhoods are defined, such as for example the cubelets indicated in FIG. 2. If not already present in a polar representation, the RD data within each cubelet is transformed to be given by an absolute value/amplitude component and a phase component.

For each data bin or pixel within a limited neighborhood, the following computations are performed over the receive channel dimension (antenna domain). The amplitude components of neighboring radar data samples are jointly represented by one single value. The neighboring radar data samples are determined by selecting a group of data bins within the multi-dimensional representation, the selected data bins of one group of neighboring radar data samples having different positions in a receive channel dimension and identical positions in the remaining dimensions of the multi-dimensional representation.

For example, all $N_{ant}$ amplitude components may be jointly represented by the arithmetic mean value of the amplitude components of all radar data samples in the respective group of neighboring radar data samples. Alternatively, also a linear interpolation or a higher order parametrization between the first and the last receive channel (antenna) could be performed.

The phase components are requantized from a $N_{bit}$ representation to $\tilde{N}_{bit}$ representation with $\tilde{N}_{bit}$ being an integer value lower than $N_{bit}$.

The compression of the radar data samples generally speaking a change in the numerical representation of the radar data samples, which is very effective and specifically tailored to the radar environment.

The achievable compression can be chosen by the number of bits used for the representation of the phase component and the method to compress the amplitude. For example, using the mean value as a joint representation of the amplitudes for compression, the achievable compression factor is given by $$C_{comp} = \frac{\tilde{B}_{tot}}{B_{tot}} = \frac{N_p N_{bit} + N_p N_{and} \tilde{N}_{bit}}{2 N_p N_{ant} N_{bit}} = \frac{N_{bit} + N_{ant} \tilde{N}_{bit}}{2 N_{ant} N_{bit}}$$

Figure 8:
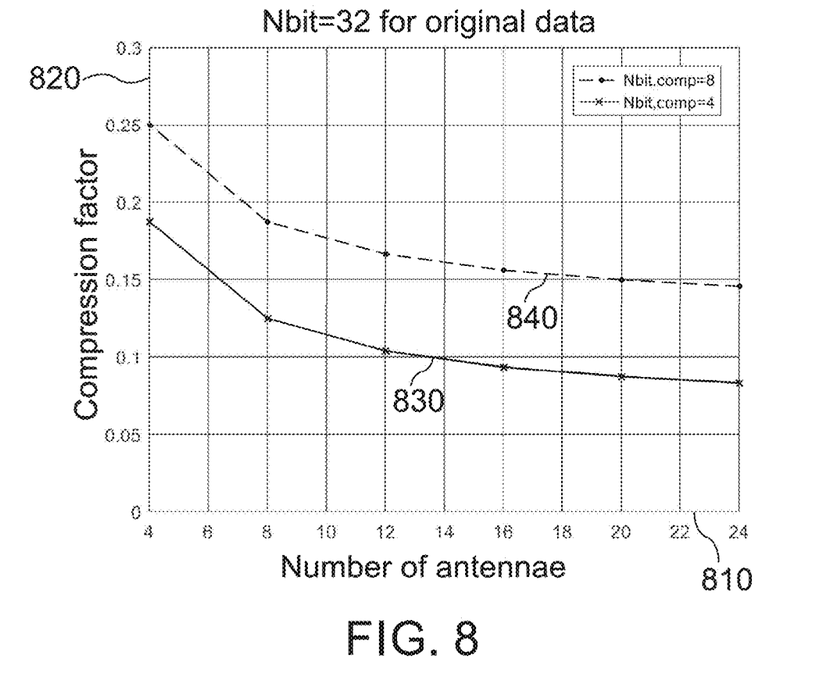
FIG. 8 shows an illustration of compression factors achievable when using embodiments of methods for generating a compact representation of radar data.

The achievable compression is illustrated in FIG. 8. FIG. 8 illustrates the number of receive channels on the x-axis 810 and the compression factor on the y-axis 820. The compression factors are illustrated in a first graph 840 for $\tilde{N}_{bit}=8$ and in a second graph 830 for $\tilde{N}_{bit}=4$, assuming $N_{bit}=32$. It is illustrated that even for only 4 receive channels and 8 compressed bits, one can already compress the data to 25% of the original amount. More receive channels allow for even more savings in data since the compression is done over the receive channel dimension (antenna domain).

Compression within the RD domain of FIG. 2 (based on a multidimensional representation having at least a first dimension for a distance, a second dimension for a velocity and a third dimension for a receive channel) may be particularly beneficial, since noise is already suppressed to some extent by the two Fourier transforms that were performed on the data previously. Noise contains little information and as such, noise suppression enhances the efficiency of the compression.

A further requirement for compressed radar data samples is the applicability to further processing and estimation steps using the compressed radar data samples. For example, the compression should not create any artefacts in the radar data samples such that in the further processing accuracy is lost or the processing becomes impossible.

Figure 9:
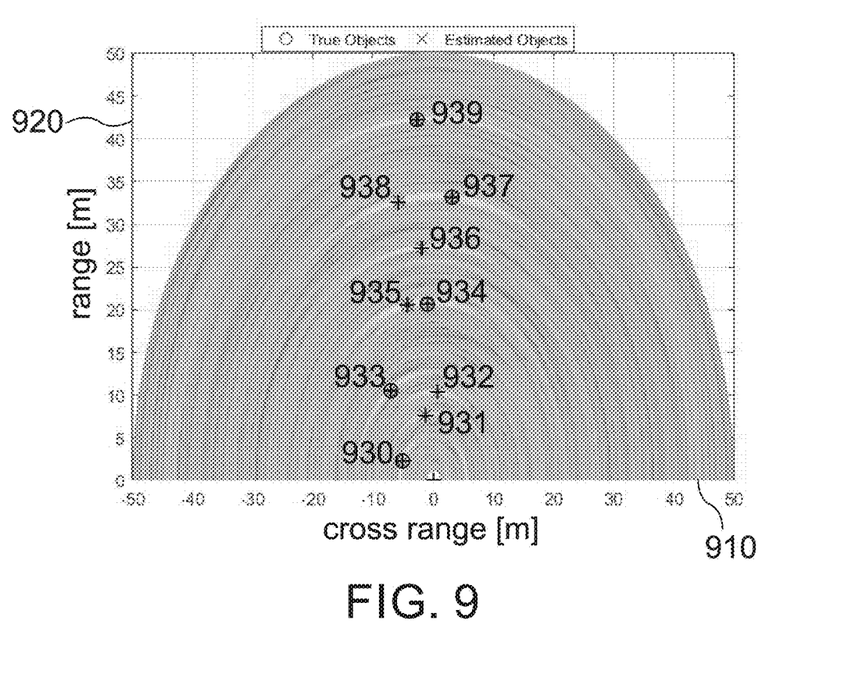
FIG. 9 shows an illustration of the accuracy achieved when determining object positions based on the compact representation of radar data.

FIG. 9 illustrates that almost no accuracy losses occur when a direction of arrival estimation is performed based on the previously described compact representation as compared to the same estimation using the uncompressed radar data samples. FIG. 9 shows the dimension perpendicular to the range direction of a radar device (i.e. the crossrange coordinate) on the x-axis 910 and the range coordinate (being the direction of movement in an automotive radar device) on the y-axis 920. Direction of arrival estimation relies on the phase differences of the signals along the receive channels, hence it is affected by a compression technique working on the phase components of the radar data samples. Distance estimation relies on the amplitude components, hence it is affected by a compression technique working on the amplitude components of the radar data samples. The underlying surface contours in FIG. 9 indicate the Fourier transform along the antenna domain, transformed to the range-crossrange domain (i.e. to Cartesian coordinates). While circles O illustrate the real position of objects, (x)- and (+)-markers show results of a MUSIC-based high-resolution DoA estimation process. The result based on uncompressed radar data samples is visualized by means of the (x) markers and the result based on compressed radar data samples (compressed to use 4 bit for the phase component) is visualized by means of the (+) markers. For the amplitude component, the mean value has been chosen as the joint representation. As illustrated in FIG. 9, the estimations are almost completely equal and hence no impairment can be observed if a compact representation of radar data according to an embodiment is used.

Figure 4:
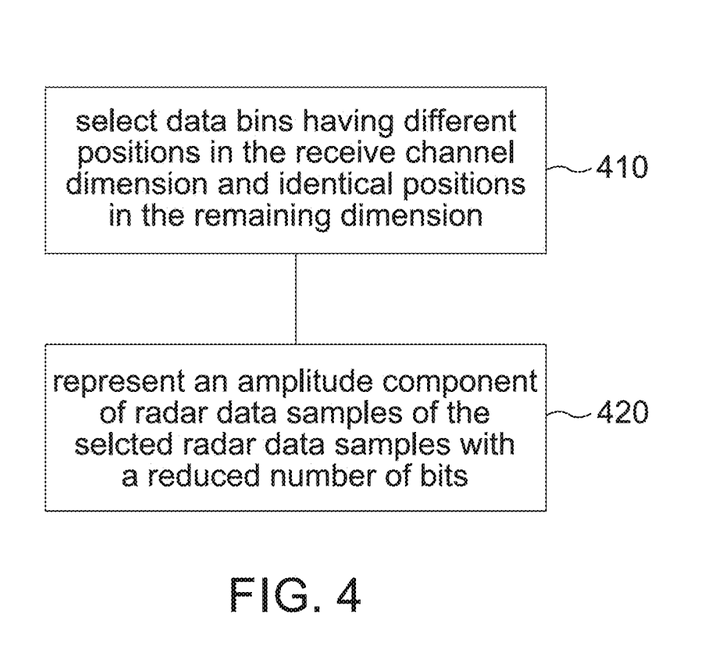
FIG. 4 illustrates a further embodiment of a method for generating a compact representation of radar data.

The above described compression by using a joint amplitude representation may not be limited to the compression of a limited neighborhood around data peaks, i.e. to one or more data cubelets. FIG. 4 illustrates an embodiment of a method for generating a compact representation of radar data which is not limited to a neighborhood of data peaks. The method comprises selecting (410) data bins within the multi-dimensional representation, the selected data bins having different positions in a receive channel dimension and identical positions in the remaining dimensions of the multi-dimensional representation. The amplitude components of radar data samples of the selected data bins are then represented with a reduced number of bits (420). The same joint representations as previously described may be applied, for example replacing the amplitude components along the receive channel direction by one value.

Figure 5:
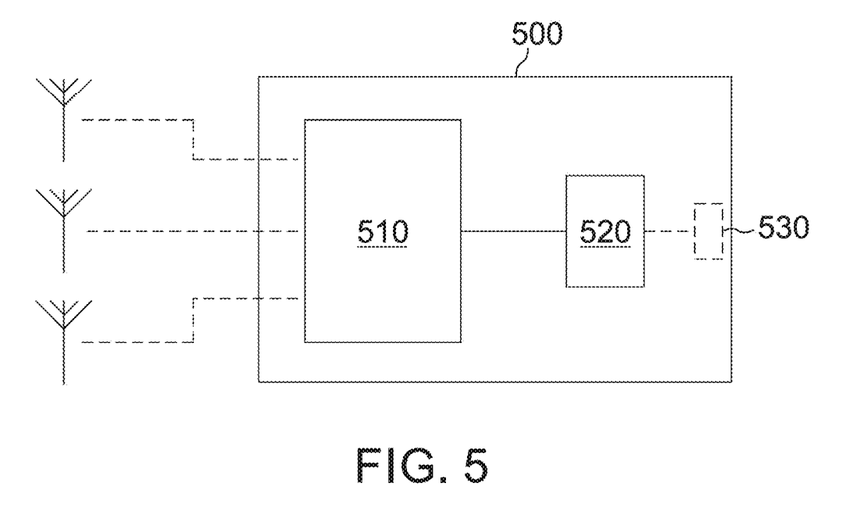
FIG. 5 illustrates an embodiment of a radar device.

According to further embodiments, compression as previously described may be performed within a radar device, e.g. by means of a radar data processor within the device. FIG. 5 schematically illustrates an embodiment of a radar device 500. The radar device 500 comprises radar data generation circuitry 510 configured to provide a multi-dimensional representation of radar data. A radar data processor 520 is configured to determine at least one data peak within the multi-dimensional representation and to compress radar data samples of the multi-dimensional representation within a limited neighborhood around the at least one data peak to generate a compact representation of radar data. The radar device 500 optionally comprises an output interface 530 configured to output the compact representation of radar data.

Figure 6:
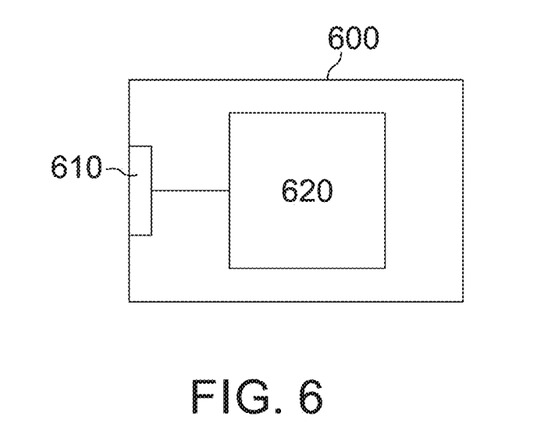
FIG. 6 illustrates an embodiment of a radar data processing circuit.

As mentioned before, radar data processing circuits having typically more computational power and the capability to receive data from numerous radar devices may benefit from the capability to receive and process a compact representation of radar data as previously described. FIG. 6 schematically illustrates an embodiment of a radar data processing circuit 600. The radar data processing circuit 600 comprises an input interface 610 configured to receive a compact representation of radar data, the compact representation comprising compressed radar data samples for a limited neighborhood around at least one data peak. A processor 620 is configured to estimate object characteristics based on the compact representation. Since the processor 620 has access to information on the radar data samples itself and not only to object lists, the processor is enabled to run more sophisticated analysis algorithms on the data so as to determine more complex characteristics of the objects causing the data peaks in the multidimensional representation. According to some embodiments, the processor is enabled to attribute an object to one of multiple object classes that reflect the nature of the object in the environment of the radar device providing the compact representation of radar data. A non-exhaustive list of object classes includes vehicles, pedestrians, cyclists, motorcyclists, buildings, trees, traffic lights, and so on. In some embodiments, the object list may in addition still be generated at the radar device and transmitted to the processor 620. This allows obtaining additional safety, by checking that both, the radar device and the processor 620 generated the same object list.

In summary, embodiments of methods, radar devices and radar data processing circuits as described herein propose to perform a compression step at a reasonable point within the signal processing flow of radar data samples. Compression is performed within a neighborhood of data peaks/detections, which is beneficial since only the relevant data is compressed and not the noise (which itself is problematic to compress). Depending on the multidimensional representation used as a basis, noise suppression may already have taken place by Fourier transforms. By the further compression of radar data samples, which is tailored to the use case, all relevant data for further processing is kept, but at a significantly reduced data rate. This may be achieved by working along the receive channel/antenna dimension, where the data is compressible. The compression method does not require any possibly artefact-generating transforms which are conventionally used in image compression methods. Although the compression may be a lossy one, the level of information loss can be well controlled by choosing the amplitude compression and the number of bits for the phase as required. The embodiments result with a relatively straightforward implementation which allows a significant reduction of the data rate or, equivalently, the transmission of the compact representation of radar data of multiple radar devices to a radar data processing circuit (fusion unit). The probability of missed detections may so be reduced. Embodiments solve the data rate problem for radar devices or radar sensors in a way allowing the transmission of relevant raw data as compressed radar data samples even over a relatively slow interface.

Figure 10:
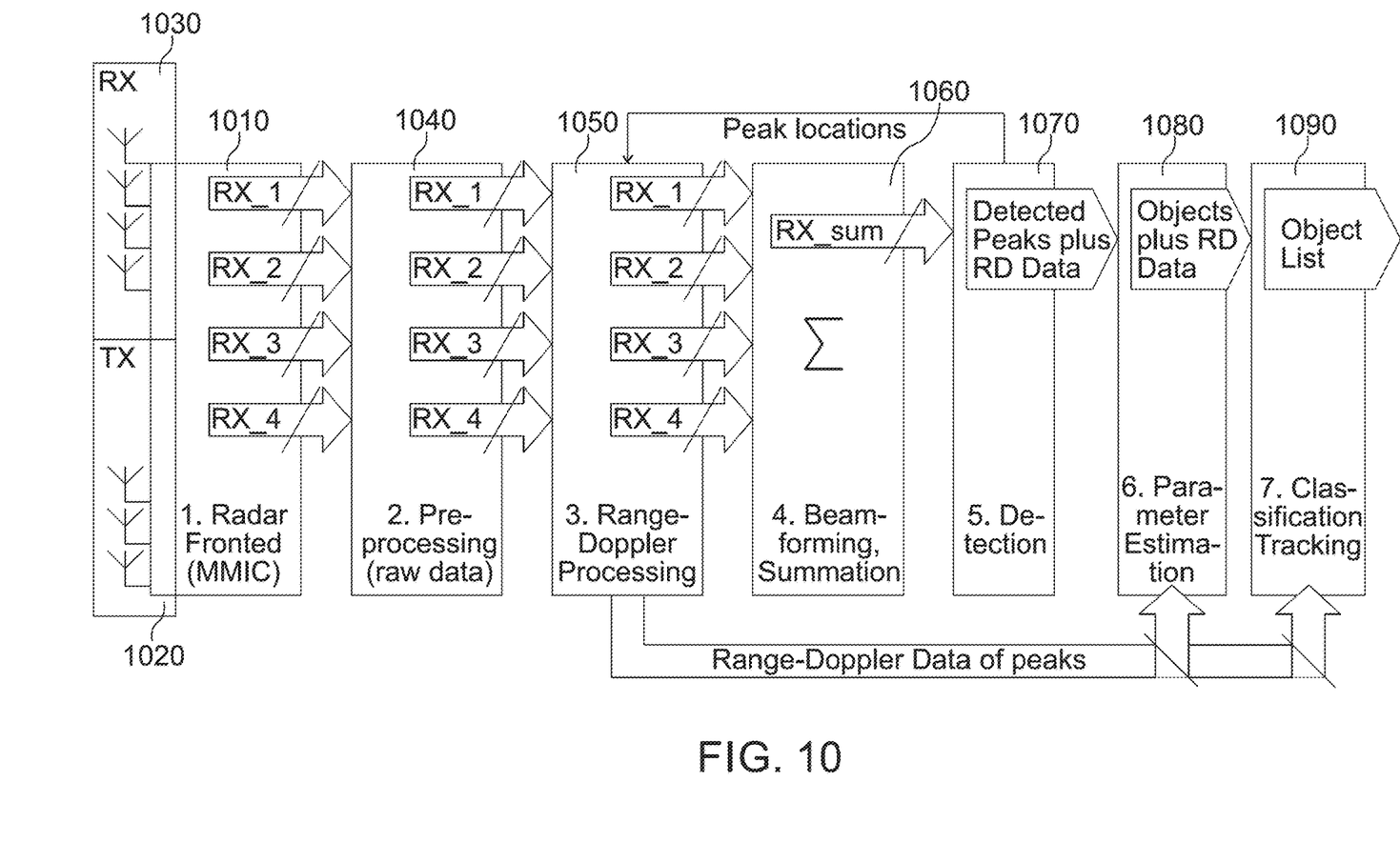
FIG. 10 shows a signal processing data flow for an automotive frequency-modulated continuous wave (FMCW) radar sensor with integrated processing.

In existing radar devices, embodiments of methods to generate a compact representation of radar data may be performed within a microcontroller following the radar frontend 1010 (MMIC), as illustrated in FIG. 10. FIG. 10 shows a possible implementation of the signal processing data flow for an automotive frequency-modulated continuous wave (FMCW) radar sensor with integrated processing. The illustrated radar device has multiple transmit (TX) antennae 1020 and multiple receive (RX) antennae 1030 to enable MIMO operation. This is useful to enable the estimation of the direction of arrival (DoA) of incoming radar signal reflections. A standard processing flow operates on the digital samples of each RX channel. FIG. 10 illustrates 4 receive channels. In other frontend implementations or in time-duplexed MIMO configurations, the number of receive channels may be larger, either by adding more physical channels or more virtual MIMO channels.

In some embodiments of radar devices or sensor chips, embodiments can be integrated within the MMIC 1010 and its processing core. Such a radar device (radar chip) may already output very relevant data in a compact representation of radar data which could optimize the overall system performance including the subsequent signal processing entities 1040, 1050, 1060, 1070, 1080, and 1090 illustrated in FIG. 10. As described before, embodiments allow to transmit (more) raw RD data by means of compressed radar data samples to higher level central processing which enables the usage of advanced estimation algorithms working on radar data samples.

The aspects and features mentioned and described together with one or more of the previously detailed examples and Figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Functions of various elements shown in the Figures, including any functional blocks labeled as "means", "means for providing a signal", "means for generating a signal.", etc., may be implemented in the form of dedicated hardware, such as "a signal provider", "a signal processing unit", "a processor", "a controller", "a circuit", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

The following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for generating a compact representation of radar data, the method comprising:
    detecting a data peak within a multi-dimensional representation of radar data, wherein the multi-dimensional representation of the radar data comprises a first dimension for distances, a second dimension for velocities, and a third dimension for a plurality of receive channels;
    selecting a first limited neighborhood around the data peak, wherein the selected first limited neighborhood includes a first plurality of data bins including a data bin of the detected data peak, wherein each data bin has a three-dimensional coordinate within the multi-dimensional representation of the radar data and uniquely corresponds to a respective radar data sample, wherein each of the first plurality of data bins has a different position in the third dimension relative to the other data bins of the first plurality of data bins and thereby corresponds to different receive channel of the plurality of receive channels, wherein each of the first plurality of data bins has an identical position in the first dimension relative to the other data bins of the first plurality of data bins, and wherein each of the first plurality of data bins has an identical position in the second dimension relative to the other data bins of the first plurality of data bins;
    compressing the respective radar data samples of the first plurality of data bins to generate the compact representation of radar data; and
    transmitting the compact representation of the radar data.

2. The method of claim 1, wherein compressing the respective radar data samples of the first plurality of data bins comprises:
    requantizing a phase component of the respective radar data samples of the first plurality of data bins.

3. The method of claim 1, wherein compressing the respective radar data samples of the first plurality of data bins comprises:
    representing an amplitude component of the respective radar data samples of the first plurality of data bins with a reduced number of bits.

4. The method of claim 3, wherein representing the amplitude component of the respective radar data samples of the first plurality of data bins comprises:
    calculating a joint parametrization for the amplitude components of the respective radar data samples of the first plurality of data bins, wherein the joint parametrization is a single value representative of all the respective radar data samples of the first plurality of data bins.

5. The method of claim 4, further comprising:
    calculating a mean value of the amplitude components of the respective radar data samples of the first plurality of data bins as the joint parametrization.

6. The method of claim 3, further comprising:
    determining the respective radar data samples of the first plurality of data bins by selecting the first plurality of data bins that include the data bin of the detected peak and that extend in the third dimension such that a number data bins of the first plurality of data bins is equal to a number of receive channels of the plurality of receive channels.

7. The method of claim 1, further comprising:
    detecting a second data peak within the multi-dimensional representation of radar data;
    selecting a second limited neighborhood around the second data peak, wherein the selected second limited neighborhood includes a second plurality of data bins including a data bin of the detected second data peak, wherein each of the second plurality of data bins has a different position in the third dimension relative to the other data bins of the second plurality of data bins and thereby corresponds to different receive channel of the plurality of receive channels, wherein each of the second plurality of data bins has an identical position in the first dimension relative to the other data bins of the second plurality of data bins and a different position in the first dimension relative to the first plurality of data bins, wherein each of the second plurality of data bins has an identical position in the second dimension relative to the other data bins of the second plurality of data bins and a different position in the second dimension relative to the first plurality of data bins;
    compressing the respective radar data samples of the second plurality of data bins to generate the compact representation of radar data; and
    transmitting the compact representation of the radar data.

8. The method of claim 1, wherein:
the selected first limited first limited neighborhood includes a neighboring data bin that is adjacent to the data bin of the detected data peak, wherein the neighboring data bin has an identical position in the third dimension relative to the data bin of the detected data peak,
wherein the selected first limited neighborhood includes a second plurality of data bins that includes the neighboring data bin, wherein each of the second plurality of data bins has a different position in the third dimension relative to the other data bins of the second plurality of data bins and thereby corresponds to different receive channel of the plurality of receive channels, wherein each of the second plurality of data bins has an identical position in the first dimension relative to the other data bins of the second plurality of data bins, and wherein each of the second plurality of data bins has an identical position in the second dimension relative to the other data bins of the second plurality of data bins, and
wherein compressing includes compressing the respective radar data samples of the first plurality of data bins and the respective radar data samples of the second plurality of data bins to generate the compact representation of radar data.

9. The method of claim 8, wherein compressing includes jointly compressing the respective radar data samples of the second plurality of data bins into a compressed radar data sample that is represented by a signal value.

10. The method of claim 8, wherein compressing includes jointly compressing the respective radar data samples of the first plurality of data bins and the respective radar data samples of the second plurality of data bins into a compressed radar data sample that is represented by a signal value.

11. The method of claim 1, wherein compressing includes jointly compressing the respective radar data samples of the first plurality of data bins into a compressed radar data sample that is represented by a signal value.

12. A method for generating a compact representation of radar data based on a multi-dimensional representation of the radar data in which a receive channel dimension represents a plurality of receive channels, the method comprising:
selecting a plurality of data bins within the multi-dimensional representation of the radar data, wherein each data bin has a three-dimensional coordinate within the multi-dimensional representation of the radar data and uniquely corresponds to a respective radar data sample, wherein each of the selected plurality of data bins has a different position in the receive channel dimension thereby corresponding to a different receive channel of the plurality of receive channels and identical positions in remaining dimensions of the multi-dimensional representation of the radar data, the remaining dimensions being different from the receive channel dimension;
jointly compressing the respective radar data samples of the selected plurality of data bins into a compressed radar data sample by representing an amplitude component of the respective radar data samples of the selected plurality of data bins with a reduced number of bits, thereby generating the compressed radar data sample that represents the respective radar data samples of the selected plurality of data bins by a single value; and
transmitting the compressed radar data sample as the compact representation of the radar data.

13. The method of claim 12, further comprising:
calculating a joint parametrization for the amplitude component of the neighboring radar data samples to represent the amplitude component with the reduced number of bits.

14. The method of claim 12, further comprising,
selecting a neighboring data bin adjacent to one of the selected plurality of data bins in the receive channel dimension;
selecting a plurality of neighboring data bins, including the selected neighboring data bin, wherein each of the selected neighboring data bins has a different position in the receive channel dimension thereby corresponding to a different receive channel of the plurality of receive channels and an identical position in the remaining dimensions of the multi-dimensional representation of the radar data;
jointly compressing the respective radar data samples of the selected neighboring data bins into a neighboring compressed radar data sample by representing the amplitude component of the respective radar data samples of the selected neighboring data bins with the reduced number of bits, thereby generating the neighboring compressed radar data sample that represents the respective radar data samples of the selected neighboring data bins by a single value; and
transmitting the compressed radar data sample and the neighboring compressed radar data sample as the compact representation of the radar data.

15. A radar device, comprising:
radar data generation circuitry configured to provide a multi-dimensional representation of radar data, wherein the multi-dimensional representation of the radar data comprises a first dimension for a distance, a second dimension for a velocity, and a third dimension for a receive channel; and
a radar data processor configured to determine a data peak within the multi-dimensional representation of the radar data, and compress radar data samples of the multi-dimensional representation of the radar data located within a limited neighborhood around the data peak to generate a compact representation of the radar data,
wherein the radar data processor is configured to select the limited neighborhood around the data peak, wherein the selected limited neighborhood includes a first plurality of data bins including a data bin of the data peak, wherein each data bin has a three-dimensional coordinate within the multi-dimensional representation of the radar data and uniquely corresponds to a respective radar data sample, wherein each of the first plurality of data bins has a different position in the third dimension relative to the other data bins of the first plurality of data bins and thereby corresponds to different receive channel of the plurality of receive channels, wherein each of the first plurality of data bins has an identical position in the first dimension relative to the other data bins of the first plurality of data bins, and wherein each of the first plurality of data bins has an identical position in the second dimension relative to the other data bins of the first plurality of data bins, and
wherein the radar data processor is configured to compress the respective radar data samples of the first plurality of data bins to generate the compact representation of radar data.

16. The radar device of claim 15, wherein the radar data processor is further configured to represent an amplitude component of neighboring radar data samples with a reduced number of bits, wherein the neighboring radar data samples are associated with at least one of the respective radar data samples of the first plurality of data bins.

17. The radar device of claim 15, wherein the radar data processor is further configured to requantize a phase component of the respective radar data samples of the first plurality of data bins.

18. The radar device of claim 15, further comprising:
a processor configured to estimate a direction of arrival of a radar echo based on the compact representation of the radar data.

19. A radar data processing circuit, comprising:
an input interface configured to receive a compact representation of radar data, the compact representation of the radar data comprising compressed radar data samples taken from a limited neighborhood around a data peak,
wherein the radar data is arranged in multi-dimensional representation comprising first, second, and third dimensions,
wherein the limited neighborhood includes a plurality of data bins including a data bin of the data peak, wherein each data bin has a three-dimensional coordinate within the multi-dimensional representation of the radar data and uniquely corresponds to a respective radar data sample, wherein each of the plurality of data bins has a different position in the first dimension relative to the other data bins of the plurality of data bins and thereby corresponds to different receive channel of a plurality of receive channels, wherein each of the plurality of data bins has an identical position in the second dimension relative to the other data bins of the plurality of data bins, and wherein each of the plurality of data bins has an identical position in the third dimension relative to the other data bins of the plurality of data bins,
wherein the respective radar data samples of the plurality of data bins have been jointly compressed into the compressed radar data samples; and
a processor configured to estimate object characteristics based on the compact representation of the radar data.

20. The radar data processing circuit of claim 19, wherein the processor is configured to determine a direction of arrival of a radar echo associated to an object based on the compact representation of the radar data.

21. The radar data processing circuit of claim 19, wherein the processor is configured to attribute an object to one of multiple object classes based on the compact representation of the radar data.

22. The radar data processing circuit of claim 19, further comprising:
a decompression circuit configured to evaluate a joint parametrization of the compressed radar data samples to calculate amplitude components of neighboring radar data samples.

* * * * *